United States Patent
Seo et al.

(10) Patent No.: US 10,373,965 B2
(45) Date of Patent: Aug. 6, 2019

(54) OTP CELL HAVING A REDUCED LAYOUT AREA

(71) Applicant: MagnaChip Semiconductor, Ltd., Cheongju-si (KR)

(72) Inventors: Young Chul Seo, Gwangmyeong-si (KR); Duk Ju Jeong, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/637,477

(22) Filed: Jun. 29, 2017

(65) Prior Publication Data

US 2018/0047736 A1    Feb. 15, 2018

(30) Foreign Application Priority Data

Aug. 9, 2016    (KR) .................... 10-2016-0101304

(51) Int. Cl.
| | | |
|---|---|---|
| *H01L 23/52* | (2006.01) | |
| *H01L 27/112* | (2006.01) | |
| *G11C 17/12* | (2006.01) | |
| *H01L 23/525* | (2006.01) | |
| *G11C 17/16* | (2006.01) | |
| *G11C 17/18* | (2006.01) | |

(52) U.S. Cl.
CPC ...... *H01L 27/11206* (2013.01); *G11C 17/123* (2013.01); *G11C 17/16* (2013.01); *G11C 17/18* (2013.01); *H01L 23/5252* (2013.01)

(58) Field of Classification Search
CPC ........... H01L 27/11206; H01L 23/5252; G11C 17/16; G11C 17/18

USPC .......................... 257/529, 530, 209, E23.147
See application file for complete search history.

(56) References Cited

U.S. PATENT DOCUMENTS

| | | | |
|---|---|---|---|
| 5,608,258 A * | 3/1997 | Rajkanan | H01L 27/0629 257/296 |
| 7,402,855 B2 | 7/2008 | Kurjanowicz | |
| 8,208,312 B1 * | 6/2012 | Novosel | G11C 17/16 365/189.011 |
| 2001/0050407 A1 * | 12/2001 | Gelsomini | H01L 23/5252 257/530 |
| 2003/0042548 A1 * | 3/2003 | Maeda | H01L 21/26586 257/369 |
| 2013/0062703 A1 * | 3/2013 | Agam | H01L 23/5252 257/369 |
| 2014/0340955 A1 * | 11/2014 | Wu | H01L 27/11206 365/104 |
| 2015/0287730 A1 * | 10/2015 | Wu | G11C 5/06 365/96 |
| 2016/0141049 A1 * | 5/2016 | Song | G11C 17/16 365/51 |
| 2018/0005704 A1 * | 1/2018 | Takaoka | G11C 17/16 |

* cited by examiner

*Primary Examiner* — Mohammed Shamsuzzaman
*Assistant Examiner* — Aaron J Gray
(74) *Attorney, Agent, or Firm* — NSIP Law

(57) ABSTRACT

An anti-fuse device includes: a well region disposed in a semiconductor substrate; a gate electrode disposed on a gate insulating film on the semiconductor substrate; and a first well bias tap region disposed below the gate insulating film and the gate electrode in the well region, wherein the well bias tap region is doped with dopants of a same conductivity type as the well region.

24 Claims, 10 Drawing Sheets

FIG. 8

| Cell | State | Program | | Read | |
|---|---|---|---|---|---|
| | | WL | BL | WL | BL |
| Cell 0 | Programmed | VPP | VPP | VREAD | VREAD |
| Cell 1 | Unprogrammed | VPP | 0 | VREAD | 0 |
| Cell 2 | Unprogrammed | 0 | VPP | 0 | VREAD |
| Cell 3 | Unprogrammed | 0 | 0 | 0 | 0 |

OTP CELL HAVING A REDUCED LAYOUT AREA

CROSS-REFERENCE TO RELATED APPLICATIONS

This application claims the benefit under 35 U.S.C. § 119(a) of Korean Patent Application No. 10-2016-0101304, filed on Aug. 9, 2016 in the Korean Intellectual Property Office, the entire disclosure of which is incorporated herein by reference for all purposes.

FIELD

The following description relates to a one-time programmable (OTP) cell, and more particularly, to an OTP cell that can be manufactured within a small layout area.

DESCRIPTION OF RELATED ART

As is known, a non-volatile one-time programmable (OTP) memory has the characteristic that information stored therein does not disappear, even in a power-off condition. For this reason, the OTP memory has firmly established its position as an essential element of a modern semiconductor integrated circuit device. The OTP memory has multiple cells each constituting a unit cell of the memory, which is referred to as an "OTP cell." The OTP cell may be used for various purposes other than forming a non-volatile memory. For example, a few OTP cells may be utilized to tune or trim parameters of an analog circuit device or to set operational parameters in a device such as a micro-controller or a micro-processor. Furthermore, the OTP cells may also be utilized to permanently store a relatively small number of data bits, such as identification data of an integrated circuit chip, a code of an encryption key, and information for management.

The OTP cell may generally be implemented as a charge storage type, a capacitor type, a fuse, or an anti-fuse. Among these variations, the anti-fuse is known to be initially in a non-conductive state and to become conductive when programmed, unlike the fuse. To program the anti-fuse, a high dielectric field is applied to a dielectric material such as oxide to allow a tunneling current to flow through the dielectric material. The tunneling current flowing through the dielectric material causes a phenomenon referred to as "dielectric breakdown." If dielectric breakdown occurs, a conductive path through the dielectric material is formed, and accordingly, the anti-fuse becomes conductive.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an anti-fuse device includes: a well region disposed in a semiconductor substrate; a gate electrode disposed on a gate insulating film on the semiconductor substrate; and a first well bias tap region disposed below the gate insulating film and the gate electrode in the well region, wherein the well bias tap region is doped with dopants of a same conductivity type as the well region.

The first well bias tap region may be grounded via a first contact.

The anti-fuse device may further include a second well bias tap region spaced apart from the first well bias tap region, and disposed below the gate insulating film and the gate electrode in the well region, wherein the second well bias tap region is doped with dopants of a same conductivity type as the well region.

The second well bias tap region may be grounded via a second contact.

The well region may be a p-type well region, and the first well bias tap region and the second well bias tap region may be doped with p-type dopants.

The gate electrode, the gate insulating film, and a portion of the well region below the gate electrode and the gate insulating film may constitute a program region. The first well bias tap region and the second well bias tap region may be disposed adjacent to the program region.

The gate electrode and the gate insulating film may be arranged in a stack. The anti-fuse device may further include sidewall spacers disposed at sidewalls of the stack on the semiconductor substrate. At least a portion of the first well bias tap region and at least a portion of the second well bias tap region may be in contact with the sidewall spacers, respectively.

In another general aspect, an anti-fuse device includes: a program region including a well region disposed on a semiconductor substrate, and a gate electrode disposed on a gate insulating film on the semiconductor substrate; and a well bias tap region disposed adjacent to the program region in the well region.

The well bias tap region may include two well bias taps spaced apart from each other and disposed below the gate insulating film and the gate electrode in the well region. The two well bias taps may be each grounded via a contact.

The well bias tap region may be doped with dopants of a same conductivity type as the well region.

The well region may be a p-type well region, and the well bias tap region is doped with p-type dopants.

The gate electrode and the gate insulating film may be arranged in a stack. The anti-fuse device may further include a sidewall spacer disposed at a sidewall of the stack on the semiconductor substrate. A portion of the well bias tap region may be in contact with the sidewall spacer.

In another general aspect, a one-time programmable (OTP) cell array includes OTP cells arranged in a matrix pattern. Each of the OTP cells includes a selection transistor and an anti-fuse. The selection transistor includes a first gate electrode disposed on a first gate insulating film on a well region of a semiconductor substrate, and first and second doped regions disposed in the well region. The anti-fuse includes a second gate electrode disposed on a second gate insulating film on the well region. At least one OTP cell among the OTP cells includes a first well bias tap region disposed below the second gate insulating film and the second gate electrode in the well region. The first well bias tap region is doped with dopants of a same conductivity type as the well region, and the first and second doped regions are doped with dopants of a different conductivity type from the well region.

The first well bias tap region may be grounded via a contact.

The at least one OTP cell may further include a second well bias tap region spaced apart from the well bias tap region, and disposed below the second gate insulating film and the second gate electrode in the well region. The second well bias tap region may be doped with dopants of a same conductivity type as the well region.

The second well bias tap region may be grounded via a second contact.

The well region may be a p-type well region, and the first well bias tap region and the second well bias tap region may be doped with p-type dopants.

The second gate electrode, the second gate insulating film, and a portion of the well region below the second gate electrode and the second gate insulating film may constitute a program region. The first well bias tap region and the second well bias tap region may be disposed adjacent to the program region.

The second gate electrode and the second gate insulating film may be arranged in a stack. The at least one OTP cell may further include sidewall spacers disposed respectively at sidewalls of the stack on the semiconductor substrate. A portion of the first well bias tap region and a portion of the second well bias tap region may be in contact with the sidewall spacers, respectively.

In another general aspect, a one-time programmable (OTP) cell array includes: OTP cells arranged in a matrix pattern, wherein each of the cells comprises a selection transistor and an anti-fuse. The selection transistor includes a first gate electrode disposed on a first gate insulating film on a first well region of a semiconductor substrate, and first and second doped regions formed in the first well region. The anti-fuse includes a second gate electrode disposed on a second gate insulating film on a second well region of the semiconductor substrate. At least one OTP cell among the OTP cells includes a well bias tap region disposed below the second gate insulating film and the second gate electrode in the second well region. The well bias tap region is doped with dopants of a same conductivity type as the second well region, and the first well region includes a doping concentration that is higher than a doping concentration of the second well region.

In another general aspect, a one-time programmable (OTP) cell includes: a well disposed on a semiconductor substrate; a transistor disposed in a first transistor area and including a first gate insulating film disposed on the first portion of the well, a first gate electrode disposed on the first gate insulating film, and doped regions disposed in the first portion of the well region; an anti-fuse disposed in a second transistor area adjacent to the first transistor area and including a second gate insulating film disposed on a second portion of the well, and a second gate electrode disposed on a second gate insulating film; a well bias tap region disposed below the second gate insulating film in the second portion of the well; and a shallow trench isolation disposed between the first transistor area and the second transistor area. The doped regions include a dopant of a conductivity type that is different than a conductivity type of the well, and the well bias tap regions include a dopant of a conductivity type that is the same as the conductivity type of the well.

The first portion of the well may have a doping concentration that is higher than a doping concentration of the second portion of the well.

The OTP cell may further include sidewall spacers disposed at sidewalls of the second gate insulating film and the second gate electrode, wherein the well bias tap regions are in contact with the sidewall spacers.

The first well portion and the second well portion may be partially separated by the shallow trench isolation, and may be in contact with each other below the shallow trench isolation.

Other features and aspects will be apparent from the following detailed description, the drawings, and the claims.

BRIEF DESCRIPTION OF THE DRAWINGS

FIG. 8 is a view illustrating a truth table explaining program and read operations for each cell in the OTP cell array shown in FIG. 7, according to an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
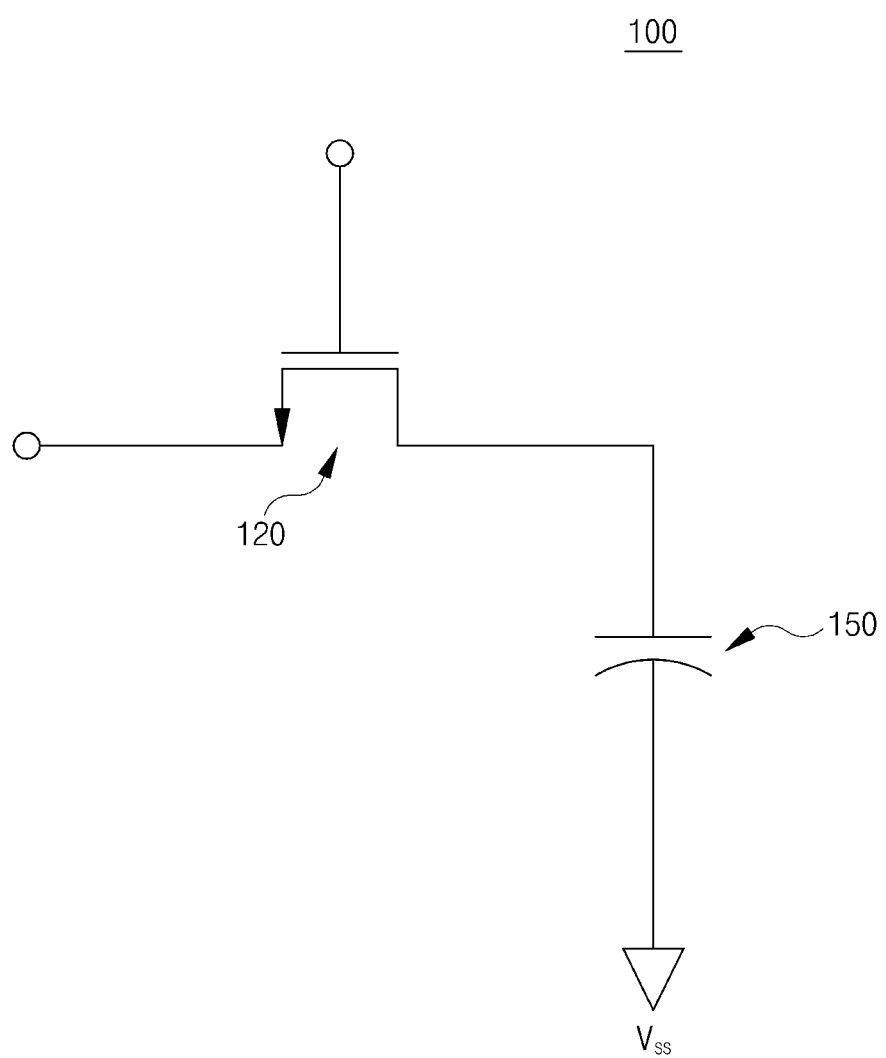
FIG. 1 is a view illustrating an equivalent circuit of a one-time programmable (OTP) cell, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Embodiments will be described in more detail below with reference to the appended drawings. However, in the following description, when there is a risk of a description of a known function of configuration unnecessarily obscuring the disclosed subject matter, such a description of the known function or configuration will be omitted.

FIG. 1 is a view illustrating an embodiment of an equivalent circuit of a one-time programmable (OTP) cell 100, according to an embodiment.

As illustrated in FIG. 1, the OTP cell 100 includes a selection transistor 120 and an anti-fuse 150 serially connected to the selection transistor 120. The selection transistor 120 may be an n-type metal-oxide-semiconductor field-effect transistor (MOSFET) or a p-type MOSFET. In a case in which the selection transistor 120 is an n-type MOSFET, as in the illustrated embodiment, a drain terminal of the selection transistor 120 is connected to a path, such as a bit line BL of a memory array circuit, to which a program voltage VPP is applied, and a source terminal of the selection transistor 120 is connected to the anti-fuse 150. Agate terminal of the anti-fuse transistor 120 is connected to a line, such as a word line WL of a memory array circuit, to which an enable signal is applied. The anti-fuse 150 may be a capacitor having one terminal connected to the source terminal of the selection transistor 120 and the other terminal connected to a ground voltage such as voltage Vss.

Figure 2:
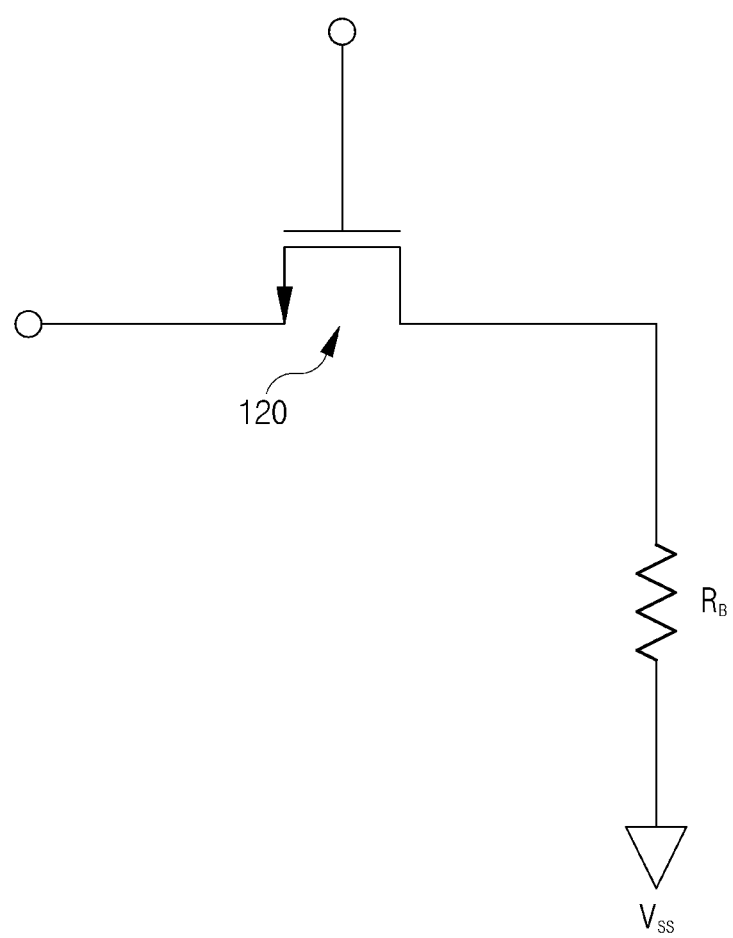
FIG. 2 is a view illustrating an equivalent circuit of a programmed OTP cell, according an embodiment.

When the program voltage VPP is applied to the drain terminal of the selection transistor 120 and the enable signal having a same voltage level as the program voltage VPP, for example, is applied to the gate terminal of the selection transistor 120, a path is formed between the drain and the source of the selection transistor 120 to allow voltage (write voltage) to be applied to the capacitor. As a result, an insulating film of the capacitor is broken down and the capacitor functions as a resistive path having an arbitrary resistance value RB, as illustrated in FIG. 2. In this case, the anti-fuse 150 is considered to have been programmed, and the resistance value RB is called a "blowing resistance." In an embodiment, to facilitate the insulating film of the capacitor being easily broken down with a relatively low voltage, the gate insulating film in a MOS transistor structure, which implements the capacitor, is formed to be thinner than the gate insulating film of the selection transistor 120. For this reason, the anti-fuse 150 is implemented in a low voltage (LV) transistor area on a semiconductor substrate, and the selection transistor 120 is implemented in a middle voltage (MV) transistor area on the semiconductor substrate. It is known that the gate insulating film of the MOS transistor implemented in the LV transistor area is broken down when a voltage of about DC 1.5 V is applied to the gate of the MOS transistor, and the gate insulating film of the MOS transistor implemented in the MV transistor area is broken down when a voltage of about DC 5 V is applied to the gate of the MOS transistor.

Figure 3:
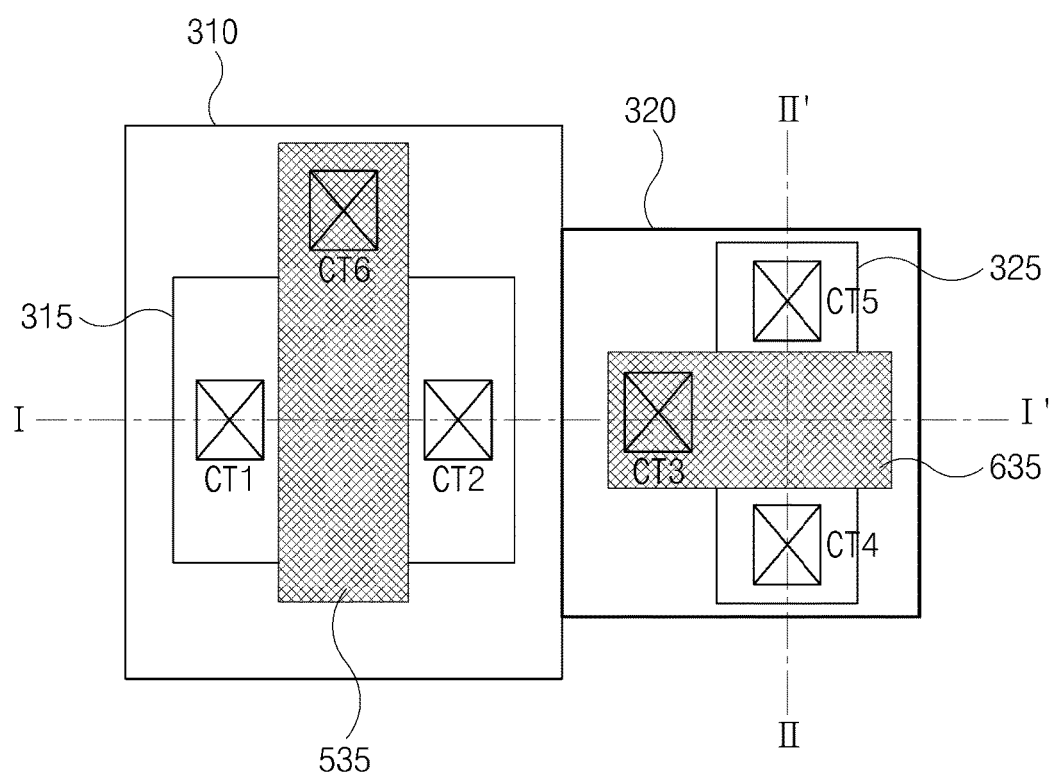
FIG. 3 is a view illustrating a layout diagram of the OTP cell of FIG. 1, according to an embodiment.
Figure 4A:
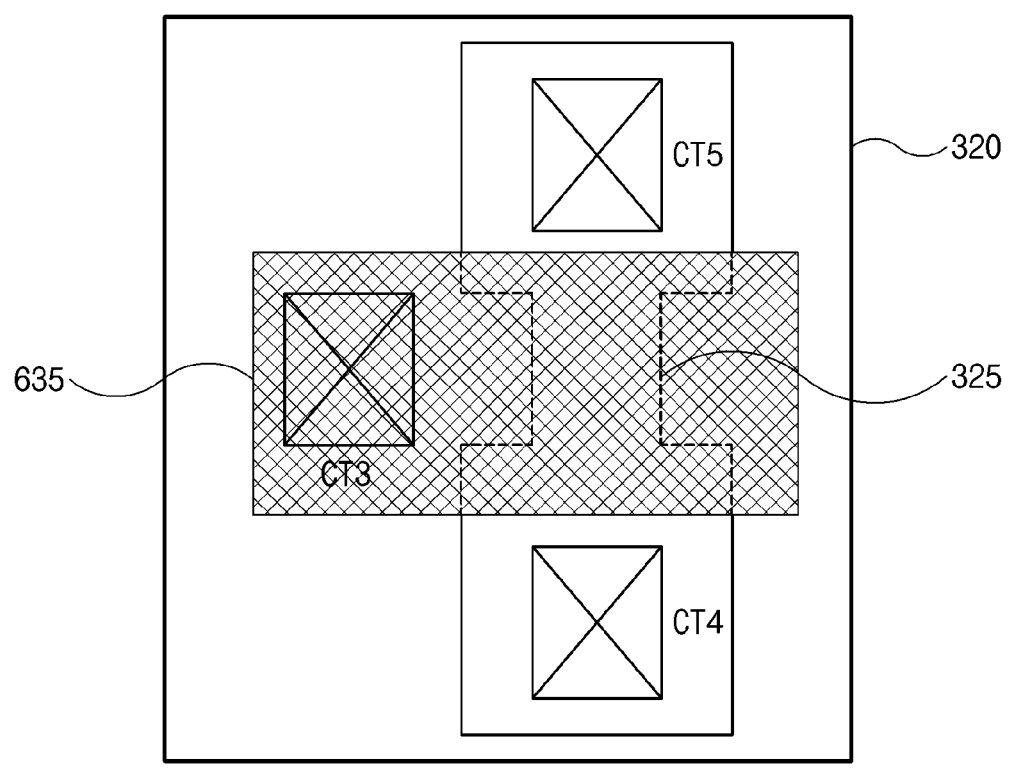
FIG. 4A to FIG. 4C are views illustrating patterns of an active area in a LV transistor shown in FIG. 3, according to embodiments.
Figure 4B:
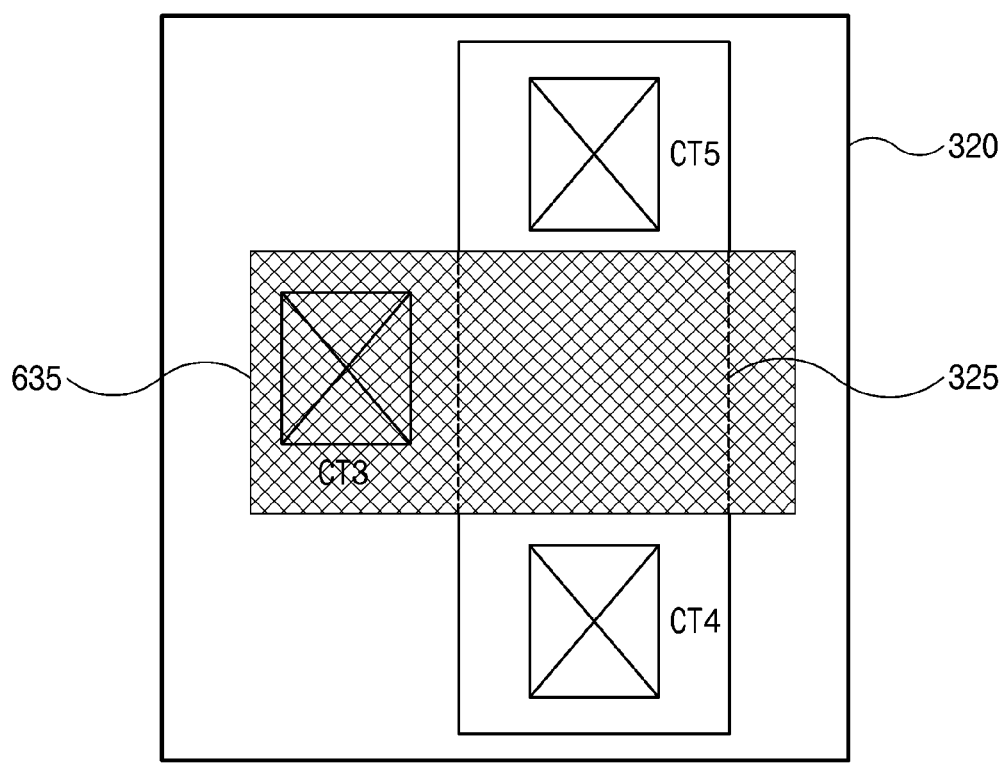
Figure 4C:
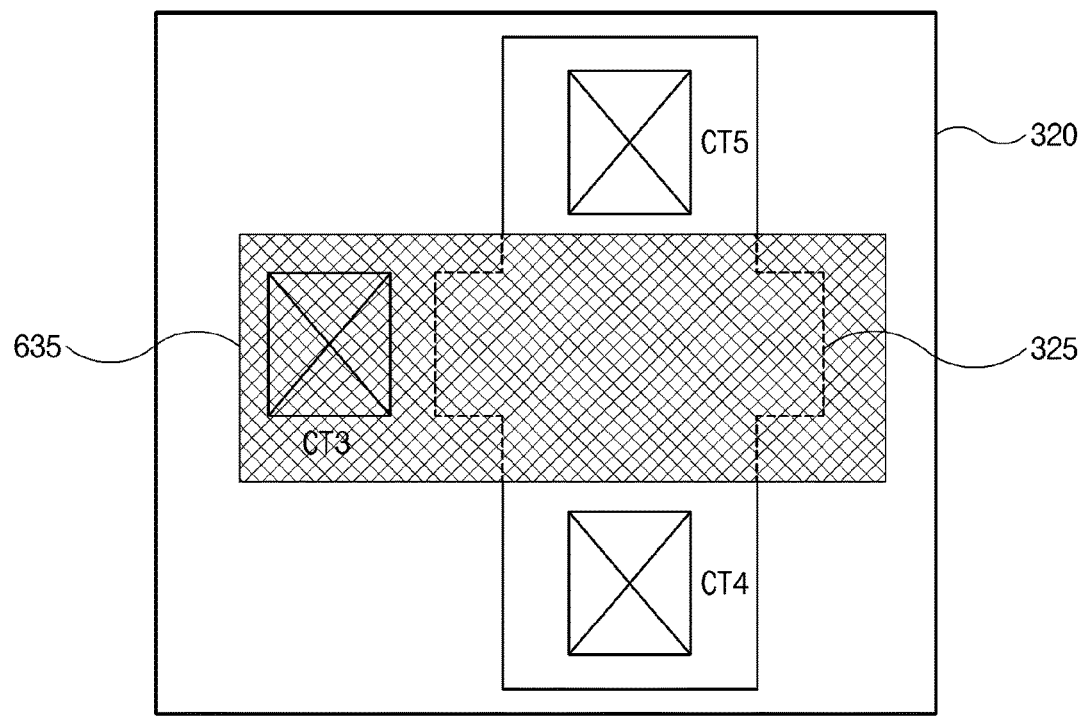
Figure 5:
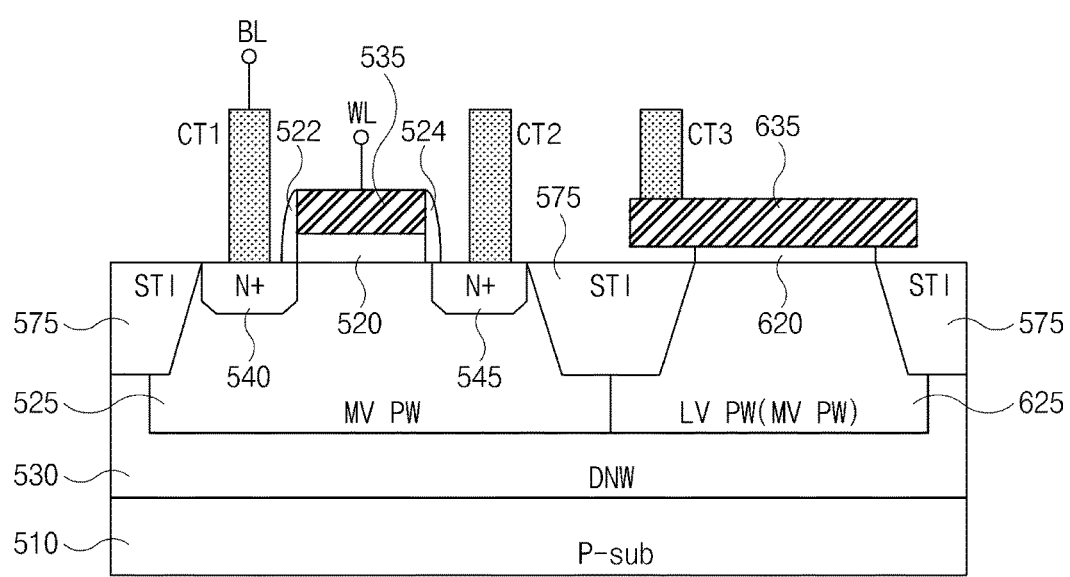
FIG. 5 is a view illustrating a cross-sectional view of the OTP cell taken along line I-I' in FIG. 3, according to an embodiment.
Figure 6:
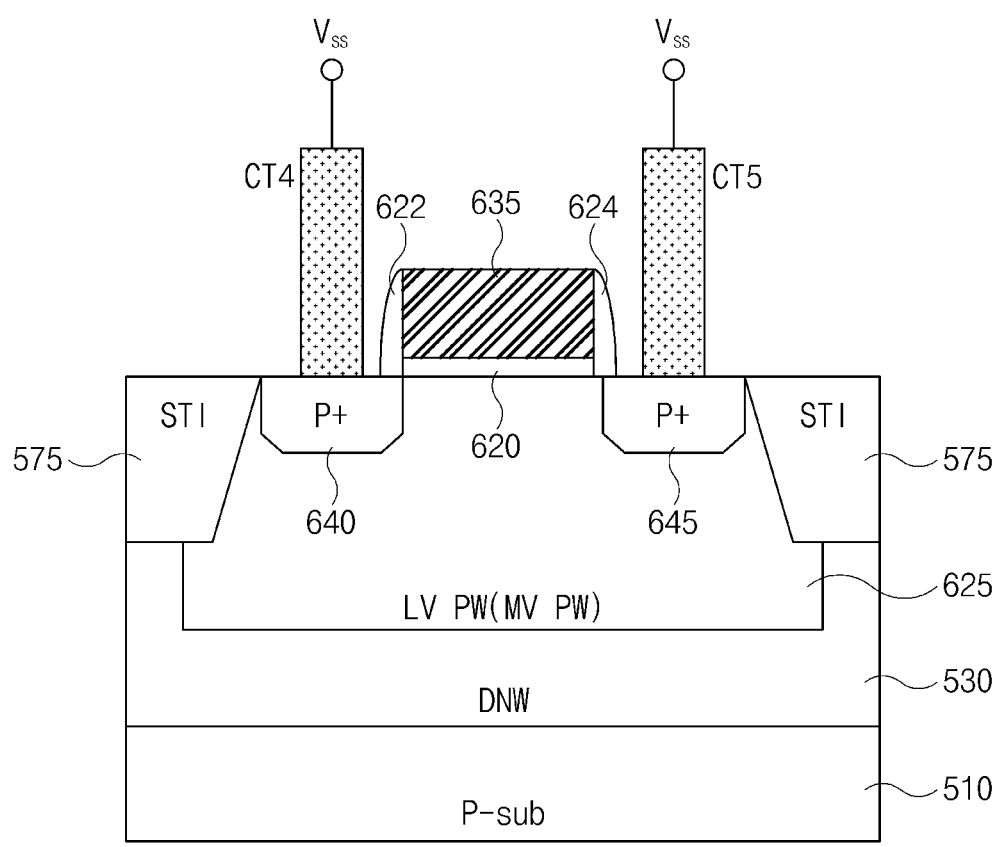
FIG. 6 is a view illustrating a cross-sectional view of the OTP cell taken along line II-II' in FIG. 3, according to an embodiment.

FIG. 3 is a view illustrating an embodiment of a layout diagram of the OTP cell 100 of FIG. 1. FIG. 4A to FIG. 4C are views illustrating embodiments of patterns of an active area in an LV transistor shown in FIG. 3. FIG. 5 is a view illustrating an embodiment of a cross-sectional view of the OTP cell 100 taken along line I-I' in FIG. 3. FIG. 6 is a view illustrating an embodiment of a cross-sectional view of the OTP cell 100 taken along line II-II' in FIG. 3. Hereinafter, the structure of the OTP cell 100 will be explained in detail with reference to FIG. 3 to FIG. 6

As shown in FIG. 3, a region in which the OTP cell 100 is formed on a semiconductor substrate 510 (FIGS. 5 and 6) includes an MV transistor area 310, in which the selection transistor 120 is formed, and an LV transistor area 320, in which the anti-fuse 150 is formed and which is arranged adjacent to the MV transistor area 310. The MV transistor area 310 and the LV transistor area 320 are separated from each other by a shallow trench isolation (STI) 575 formed in regions in the semiconductor substrate 510 other than an active region 315 and an active region 325, as shown in FIGS. 3, 5 and 6. Although FIG. 5 and FIG. 6 illustrate that the active region 315 and the active 325 are separated by the STI 575, it should be understood that the active region 315 and the active region 325 may be separated by various forms of a separation film other than the STI 575. The active region 325 in the LV transistor area 320 may be formed in various patterns that facilitate breakdown of the gate insulating film at the time of programming. However, the active region 325 may be designed to have, for example, a mostly rectangular pattern with its middle portion being indented, a rectangular pattern, or a mostly rectangular pattern with its middle portion protruding outward, as shown in FIG. 4A, FIG. 4B, and FIG. 4C, respectively.

Referring to FIG. 5, the MV transistor area 310 includes a gate insulating film 520 formed on the semiconductor substrate 510. In an embodiment, the semiconductor substrate 510 is a bulk substrate or a silicon on insulator (SOI) substrate. In an embodiment, a semiconductor layer of the semiconductor substrate 510 is formed by a material such as Si, Ge, SiGe, GaP, GaAs, SiC, SiGeC, InAs or InP. The semiconductor substrate 510 includes a well 525 formed therein. The well 525 is formed in a deep n-well (DNW) 530, which is formed in the semiconductor substrate 510, as shown in FIG. 5. The well 525 may be formed by injecting ions of a particular conductivity type into the semiconductor substrate 510. In an embodiment, the well 525 is a p-type well formed by injecting p-type ions, as shown in FIG. 5. In an embodiment, the well 525 is formed to have a MV well structure. The gate insulating film 520 may be formed on the well 525 of the semiconductor substrate 510 by any one of an oxide film, a nitride film, an oxynitride film, and a metal oxide film, or by a laminated film including any combination of any two or more of an oxide film, a nitride film, an oxynitride film, and a metal oxide film. In an embodiment, the gate insulating film 520 is formed to have a thickness that allows the gate insulating film 520 to be broken down by the application of a voltage of about DC 5 V.

The MV transistor area 310 further includes a gate electrode 535 laminated on the gate insulating film 520. The gate electrode 535 may be formed by a polysilicon material or a metal material, for example. The gate electrode 535 has a doping type that is opposite to that of the well 525. If the well 525 is a p-type well, the gate electrode 535 is doped by ions of an n-type. Alternatively, if the well 525 is an n-type well, the gate electrode 535 is doped by ions of a p-type. The gate electrode 535 of the MV transistor area 310 may be connected to a word line WL of a memory array circuit via a contact CT6.

As shown in FIG. 5, the MV transistor area 310 further includes sidewall spacers 522, 524. The sidewall spacers 522, 524 are formed respectively at sidewalls of a stack including the gate electrode 535 and the gate insulating film 520. In an embodiment, the sidewall spacers 522, 524 are formed by an insulating film such as a silicon oxide film. In an embodiment, the sidewall spacers 522, 524 are formed by depositing an insulating film such as a silicon oxide film on the semiconductor substrate 510 by a chemical vapor deposition (CVD) process, and performing anisotropic etching on the deposited insulating film.

As illustrated in FIG. 5, the MV transistor area 310 further includes doped regions 540, 545 formed below the gate electrode 535 and the gate insulating film 520 in the active region 315, and spaced apart from each other at the left and right sides, respectively, of the gate electrode 535. The doped regions 540, 545 are formed such that at least a portion of the doped region 540 abuts the sidewall spacer 522 and at least a portion of the doped region 545 abuts the sidewall spacer 524. The doped regions 540, 545 are formed within the well 525 by injecting ions of the same type as a doping type of the gate electrode 535. Therefore, as with the gate electrode 535, the doped regions 540, 545 have a doping type that is opposite to that of the well 525. Since the gate electrode 535 is doped by n-type ions in the embodiment shown in FIG. 5, the doped regions 540, 545 are formed by injection of n-type ions. However, in an embodiment in which the well 525 is an n-type well, the doped regions 540, 545 are formed to have a p doping type. The doped region 540 constitutes a drain of the MV transistor that is implemented in the MV transistor area 310, and the doped region 545 constitutes a source of the MV transistor. Hereinafter, the doped region 540 and the doped region 545 will be referred to as a "drain region 540" and a "source region 545," respectively.

Still referring to FIG. 5, the MV transistor area 310 further includes a contact CT1 and a contact CT2 formed on the drain region 540 and the source region 545, respectively. The contact CT1 may be connected to a bit line BL of a memory array circuit.

Referring to FIG. 6, the LV transistor area 320 includes a gate insulating film 620 formed on the semiconductor substrate 510. The semiconductor substrate 510 includes a well 625. The well 625 is formed in the DNW 530, as shown in FIG. 5. As shown in FIG. 5, the well 625 and the well 525 are partially separated by the STI 575 and contact each other below the STI 575. As is the case with the well 525, the well 625 is formed by injecting ions of a particular conductivity type into the semiconductor substrate 510. In an embodiment, the well 625 is formed to have a doping concentration lower than that of the well 525. In an embodiment, the well 625 is a MV well or a LV well. If the selection transistor 120 is an n-type MOS transistor, that is, the well 525 in the MV transistor area 310 is a p-type well, the well 625 is also a p-type well. If the selection transistor 120 is a p-type MOS transistor, that is, the well 525 in the MV transistor area 310 is an n-type well, the well 625 is also an n-type well. Although FIG. 5 shows that the well 525 and the well 625 are separated, the well 525 and the well 625 may be integrally formed such that the MV transistor area 310 and the LV transistor area 320 share the same well. The shared well may be formed to have a doping concentration comparable to that of a well region to be formed in the MV transistor area 310 in the case in which the OTP cell 100 is structured to have separate wells in the MV transistor area 310 and the LV transistor area 320. Like the gate insulating film 520, the gate insulating film 620 may be formed on the well 625 by one of an oxide film, a nitride film, an oxynitride film, and a metal oxide film, or by a laminated film including any combination of any two or more of an oxide film, a nitride film, an oxynitride film, and a metal oxide film. In an embodiment, the gate insulating film 620 is formed to have a thickness less than that of the gate insulating film 520, such that the gate insulating film 620 can be broken down by the application of a low voltage of about DC 1.5 V thereto.

As shown in FIG. 6, the LV transistor area 320 further includes a gate electrode 635 laminated on the gate insulating film 620. The gate electrode 635 may be formed by a polysilicon material or a metal material, for example. The gate electrode 635 has a doping type that is opposite to that of the well 625. If the well 625 is a p-type well, the gate electrode 635 is doped by ions of an n-type, and if the well 625 is an n-type well, the gate electrode 635 is doped by ions of a p-type. Referring back to FIG. 5, the gate electrode 635 is connected to the contact CT2 formed in the MV transistor area 310 via a contact CT3 formed above the gate electrode 635. The contact CT2 and the contact CT3 are connected to each other by a metal layer. By this connection, the gate electrode 635 of the LV transistor is electrically connected to the source region 545 of the MV transistor.

The gate electrode 635, the gate insulating film 620, and the well 625 in the LV transistor area 320 described herein can function as an anti-fuse, that is, a capacitor of the OTP cell 100, and constitute a program region that enables the OTP cell 100 to be programmed.

Referring to FIG. 6, the LV transistor area 320 further includes sidewall spacers 622, 624. The sidewall spacers 622, 624 are formed respectively at sidewalls of a stack including the gate electrode 635 and the gate insulating film 620. In an embodiment, the sidewall spacers 622, 624 are formed by an insulating film such as a silicon oxide film, as is the case with the sidewall spacers 522, 524. In an embodiment, the sidewall spacers 622, 624 are formed by depositing an insulating film such as the silicon oxide film on the semiconductor substrate 510 by the CVD process, and performing anisotropic etching on the deposited insulating film, as is the case with the sidewall spacers 522, 524.

As shown in FIG. 6, the LV transistor area 320 further includes well bias tap regions 640, 645 formed adjacent to the program region. The well bias tap regions 640, 645 are formed in the active region 325 below the gate electrode 635 and the gate insulating film 620, and are spaced apart from each other at the left and right sides of the gate electrode 635, respectively. In an embodiment, the well bias tap regions 640, 645 are formed such that at least a portion of the well bias tap region 640 abuts the sidewall spacer 622 and at least a portion of the well bias tap region 645 abuts the sidewall spacer 624. The well bias tap regions 640, 645 may be used to apply a bias voltage such as DC 0 V to the well 625, which is a bulk region, and may be formed by injecting dopants (ions) that are of the same type as that of the ions used in forming the well 625, but have a higher density than those ions. The well bias tap regions 640, 645 have the same conductivity type as that of the well 525 and the well 625. Since the well 625 is a p-type well in the embodiment shown in FIG. 6, the well bias tap regions 640, 645 have a p+ doping type. The well bias tap region 640 and the well bias tap region 645 may be grounded through a connection to a ground voltage such as a voltage Vss via a contact CT4 and a contact CT5, which are formed on the well bias tap regions 640, 645, respectively. Although the embodiment shown in FIG. 6 illustrates that two well bias tap regions 640, 645 are formed in the LV transistor area 320, it is also possible to form either one of the well bias tap regions 640, 645.

The well bias tap region(s) 640, 645 are arranged adjacent to the program region in which the anti-fuse 150 is formed. That is, the well bias tap region(s) are arranged at a position corresponding to or adjacent a source region and/or a drain region in a conventional MOS transistor structure. This eliminates the necessity to layout a separate region for the well bias tap. Since the anti-fuse 150 of the OTP cell 100 has a structure in which the program region is constituted by the gate electrode 635, the gate insulating film 620, and the well 625, a layout area for the OTP cell 100 can be reduced.

Further, the MV transistor area 310, in which the selection transistor 120 is formed, and the LV transistor area 320, in which the anti-fuse 150 is formed, share a well in the semiconductor substrate 510. Thus, when the OTP cells 100 are arranged together to form an OTP cell array, it is not necessary to provide a well bias tap for each of the OTP cells 100. When the OTP cells 100 are arranged together to form the OTP cell array, a single well bias tap can be arranged per several OTP cells 100, and thus the overall layout area of the cell array can be greatly reduced.

Figure 7:
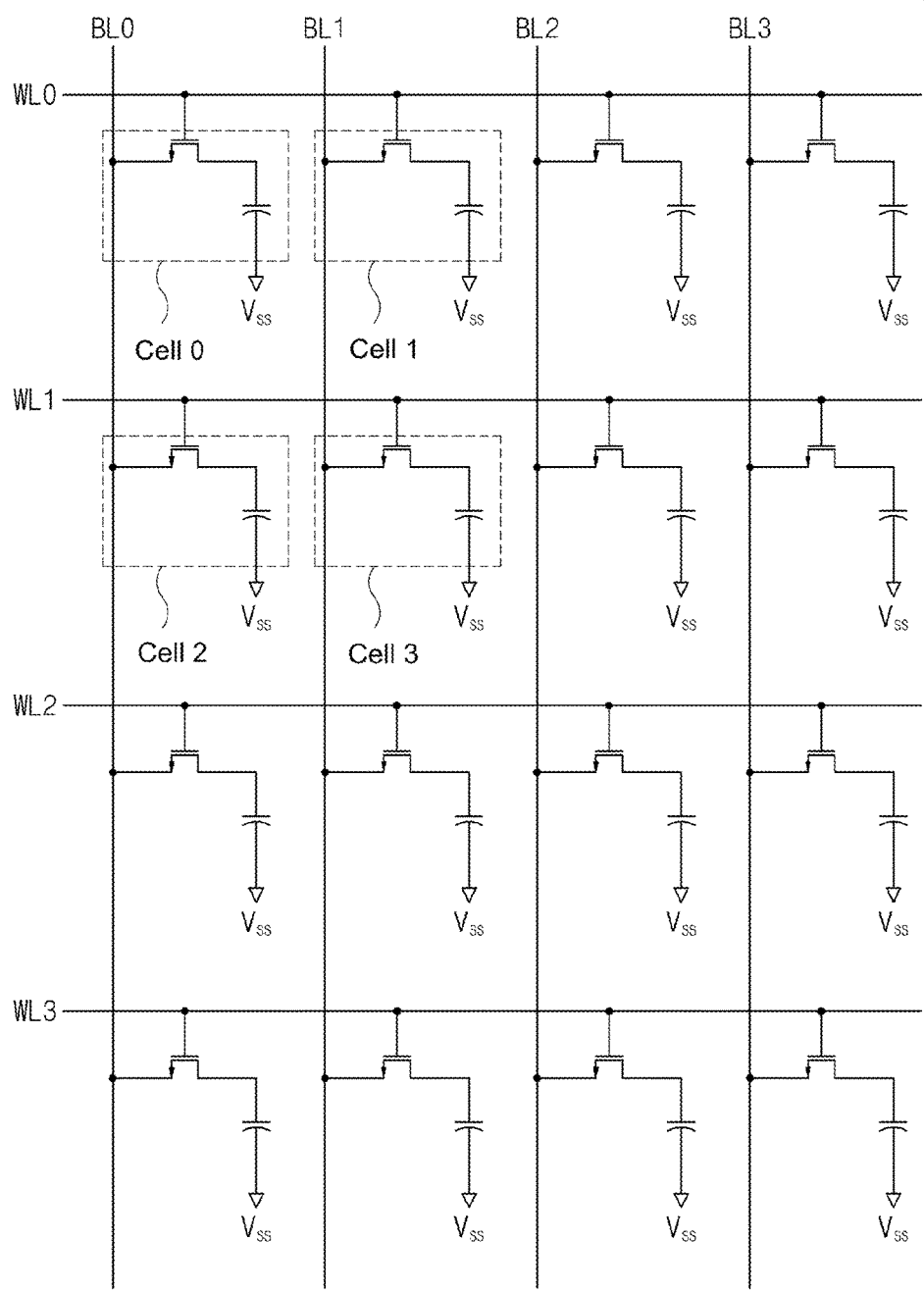
FIG. 7 is a view illustrating an OTP cell array including OTP cells according to the disclosed embodiments.

FIG. 7 is a view illustrating an embodiment of an OTP cell array 700 including OTP cells (e.g., Cell 0, Cell 2, Cell 3, etc.). FIG. 8 is a view illustrating a truth table for explaining program and read operations for each cell in the OTP cell array 700. Hereinafter, a method of programming and reading each cell in the OTP cell array 700 will be explained with reference to FIG. 7 and FIG. 8.

Referring to FIG. 7, the OTP cell array 700 includes OTP cells (e.g., Cell 0, Cell 2, Cell 3, etc.) that are arranged in a matrix pattern or a cross-point array pattern. Each of the OTP cells is an OTP cell 100 according to the disclosure herein, which includes the selection transistor 120 and the anti-fuse transistor 150 that are explained with reference to FIG. 1 and FIG. 6. The drain terminal and the gate terminal of each of the selection transistors of the OTP cells are connected to the bit lines BL0-BL3 and the word lines WL0-WL3, respectively. For example, the drain terminal and the gate terminal of the selection transistor of cell 0 is connected to the bit line BL0 and the word line WL0, respectively. In another example, the drain terminal and the gate terminal of the selection transistor of cell 3 are connected to the bit line BL1 and the word line WL1, respectively. For convenience of illustration, FIG. 7 shows sixteen (16) OTP cells. However, it should be appreciated that the number of the OTP cells constituting the OTP cell array 700 is not limited to this example, and a lesser or greater number of OTP cells 100 may be included.

In order to program each of the OTP cells, a program voltage VPP is applied to the bit lines BL0-BL3 and the word lines WL0-WL3 connected to the respective OTP cell. In order to read a particular OTP cell, a read voltage VREAD is applied to the bit lines BL0-BL3 and the word lines WL0-WL3 connected to the respective OTP cell. Specific values of the program voltage VPP and the read voltage VREAD may vary according to a design of the OTP cell. In an embodiment, the program voltage VPP is about DC 5.2 V to DC 7.2 V. In an embodiment, the read voltage is about DC 1.8 V.

In order to illustrate a method of programming each of the plurality of OTP cells in the OTP cell array 700 as shown in FIG. 7, a procedure of selecting and programming Cell 0 will be explained. In order to select and program Cell 0, the program voltage VPP is applied the bit line BL0 and the word line WL0, and 0 V is applied to the remaining bit lines BL1-BL3 and word lines WL1-WL3. In this case, the selection transistor of Cell 0 is turned on, and the program voltage VPP at the bit line BL0 is transferred to the anti-fuse of Cell 0 to thereby enable Cell 0 to be programmed. With respect to Cell 1, while the selection transistor of Cell 1 is turned on, the voltage at the bit line BL1 connected to the selection transistor is 0 V, with the result being that Cell 1 is not programmed. With respect to Cell 2, while the voltage at the bit line BL0 connected to Cell 2 is VPP, the voltage at the word line WL1 connected to Cell 2 is 0 V, with the result being that Cell 2 also is not programmed. With respect to Cell 3, the voltages at the bit line BL1 and the word line WL 1 connected to Cell 3 are all 0 V, and thus Cell 3 also is not programmed. While it has been explained above that, for the selection and programming of each OTP cell, the program voltage VPP is applied to the corresponding OTP cell, a voltage higher than the program voltage VPP may be applied to the corresponding OTP cell in order to ensure reliability of programming. It should also be noted that when the program voltage VPP is applied to the OTP cell that is to be programmed, a voltage corresponding to the program voltage VPP minus a threshold voltage Vth of the MV transistor of the corresponding OTP cell is transferred to the LV transistor of the corresponding OTP cell. Taking this into consideration, it is possible to design the related circuits such that a voltage higher than the program voltage VPP by the threshold voltage Vth can be applied to the bit lines and the word lines connected to the OTP cell to ensure that the program voltage VPP is transferred to the anti-fuses of the OTP cells.

According to the embodiments disclosed herein, it is possible to manufacture an OTP cell within a small layout area. According to the embodiments disclosed herein, it is also possible to decrease the overall layout area of an OTP cell array including a plurality of OTP cells.

In the above, the embodiments have been explained through the detailed descriptions provided above in conjunction with the drawings. However, those skilled in the relevant art should readily appreciate that the present disclosure can be embodied in various forms.

In the embodiments disclosed herein, the arrangement of the illustrated components may vary depending on an environment or requirements to be implemented. For example, some of the components may be omitted or several components may be integrated and carried out together. In addition, the arrangement order of some of the components and the like can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A one-time programmable (OTP) cell array, comprising:
    a deep well region of a first conductivity type disposed in a semiconductor substrate;
    a first well region and a second well region of a second conductivity type disposed next to each other and formed in the deep well region;
    a first gate electrode disposed on a first gate insulating film on the first well region of the semiconductor substrate and a second gate electrode disposed on a second gate insulating film on the second well region;
    a first well bias tap region disposed in the first well region;
    first and second doped regions disposed in the second well region; and
    an isolation region disposed in the semiconductor substrate,
    wherein the first well bias tap region is doped with dopants of a same conductivity type as the first well region, and
    the first and second doped regions are doped with dopants of a different conductivity type from the first well region and the second well region.

2. The OTP cell array of claim 1, wherein the first well bias tap region is connected to a first contact.

3. The OTP cell array of claim 1, further comprising a second well bias tap region spaced apart from the first well bias tap region, and disposed in the first well region,
    wherein the second well bias tap region is doped with dopants of a same conductivity type as the first well region.

4. The OTP cell array of claim 2, wherein the second well bias tap region is connected to a second contact,
    wherein the first and second well bias tap regions are formed in an active region, and
    wherein the active region has a rectangular pattern, a rectangular pattern with its middle portion being indented, or a rectangular pattern with its middle portion protruding outward.

5. The OTP cell array of claim 3, wherein the first well region is a p-type well region, the deep well region is an n-type well region, and the first well bias tap region and the second well bias tap region are doped with p-type dopants.

6. The OTP cell array of claim 3, wherein the first gate electrode, the first gate insulating film, and a portion of the first well region below the first gate electrode and the first gate insulating film constitute a program region, and
    wherein the first well bias tap region and the second well bias tap region are disposed adjacent to the program region.

7. The OTP cell array of claim 3, wherein
    the first gate electrode and the first gate insulating film are arranged in a stack,
    the OTP cell array further comprises sidewall spacers disposed at sidewalls of the stack on the semiconductor substrate, and
    at least a portion of the first well bias tap region and at least a portion of the second well bias tap region are in contact with the sidewall spacers, respectively.

8. A one-time programmable (OTP) cell array, comprising:
    a first well region and a second well region of a first conductivity type disposed next to each other and formed in a deep well region of a second conductivity type in a semiconductor substrate, and
    a first gate electrode disposed on a first gate insulating film on the first well region and a second gate electrode disposed on a second gate insulating film on the second well region;
    a well bias tap region disposed in the first well region and doped with dopants of a same conductivity type as the first well region;
    first and second doped regions disposed in the second well region and doped with dopants of a different conductivity type from the first well region and the second well region;
    a first isolation region disposed in the semiconductor substrate; and
    a gate contact plug disposed on the first gate electrode,
    wherein the first gate electrode and the gate contact plug overlap with the first isolation region.

9. The OTP cell array of claim 8, wherein the well bias tap region comprises two well bias taps spaced apart from each other, and
    wherein the two well bias taps are each connected to a contact.

10. The OTP cell array of claim 8,
    wherein the well bias tap region is formed in an active region, and
    wherein the active region has a rectangular pattern, a rectangular pattern with its middle portion being indented, or a rectangular pattern with its middle portion protruding outward.

11. The OTP cell array of claim 8, wherein the first well region is a p-type well region, and the well bias tap region is doped with p-type dopants.

12. The OTP cell array of claim 8, further comprising a second isolation region in the semiconductor substrate, wherein the first gate electrode overlaps with the second isolation region, such that the first gate electrode extends from the first isolation region to the second isolation region.

13. A one-time programmable (OTP) cell array, comprising:
OTP cells arranged in a matrix pattern, wherein each of the OTP cells comprises a selection transistor and an anti-fuse,
wherein the selection transistor comprises a first gate electrode disposed on a first gate insulating film on a first well region of a semiconductor substrate, and first and second doped regions disposed in the first well region,
wherein the anti-fuse comprises a second gate electrode disposed on a second gate insulating film on a second well region,
wherein the first and second well regions of a first conductivity type are disposed next to each other and formed in a deep well region of a second conductivity type disposed on the semiconductor substrate,
wherein at least one OTP cell among the OTP cells comprises a first well bias tap region disposed in the second well region, and
wherein the first well bias tap region is doped with dopants of a same conductivity type as the second well region, and the first and second doped regions are doped with dopants of a different conductivity type from the first well region and the second well region.

14. The OTP cell array of claim 13, wherein the first well bias tap region is connected to a contact.

15. The OTP cell array of claim 13, wherein the at least one OTP cell further comprises a second well bias tap region spaced apart from the first well bias tap region, and disposed in the second well region, and
wherein the second well bias tap region is doped with dopants of a same conductivity type as the second well region.

16. The OTP cell array of claim 15, wherein the second well bias tap region is connected to a second contact.

17. The OTP cell array of claim 15, wherein the second well region is a p-type well region, and the first well bias tap region and the second well bias tap region are doped with p-type dopants.

18. The OTP cell array of claim 15, wherein the second gate electrode, the second gate insulating film, and a portion of the second well region below the second gate electrode and the second gate insulating film constitute a program region, and
wherein the first well bias tap region and the second well bias tap region are disposed adjacent to the program region.

19. The OTP cell array of claim 15, wherein the second gate electrode and the second gate insulating film are arranged in a stack,
wherein the at least one OTP cell further comprises sidewall spacers disposed respectively at sidewalls of the stack on the semiconductor substrate, and
wherein a portion of the first well bias tap region and a portion of the second well bias tap region are in contact with the sidewall spacers, respectively.

20. A one-time programmable (OTP) cell array, comprising:
OTP cells arranged in a matrix pattern, wherein each of the OTP cells comprises a selection transistor and an anti-fuse,
wherein the selection transistor comprises a first gate electrode disposed on a first gate insulating film on a first well region of a semiconductor substrate, and first and second doped regions formed in the first well region and doped with dopants of a different conductivity type from the first well region,
wherein the anti-fuse comprises a second gate electrode disposed on a second gate insulating film on a second well region of the semiconductor substrate, first and second well bias tap regions doped with dopants of a same conductivity type as the second well region, and a gate contact plug disposed on the second gate electrode,
wherein the first well region and the second well region having a same dopant conductivity type are disposed next to each other and formed in a deep well region in the semiconductor substrate,
wherein each of the OTP cells comprises a first isolation region disposed between the selection transistor and the anti-fuse in the semiconductor substrate, and
wherein the second gate electrode and the gate contact plug overlap with the first isolation region.

21. A one-time programmable (OTP) cell, comprising:
a transistor disposed in a first well region and comprising:
a first gate insulating film disposed on a semiconductor substrate,
a first gate electrode disposed on the first gate insulating film,
doped regions doped with dopants of a different conductivity type from the first well region and disposed adjacent to the first gate electrode, and
a first contact plug disposed on one of the doped regions;
an anti-fuse disposed in a second well region disposed adjacent to the first well region and having a same conductivity type as the first well region, the anti-fuse comprising:
a first well bias tap region doped with dopants of a same conductivity type as the second well region, the first and second well regions being disposed in a deep well region in the semiconductor substrate,
a second gate insulating film disposed on the semiconductor substrate,
a second gate electrode disposed on the second gate insulating film, and
a second contact plug disposed on the second gate electrode; and
an isolation region disposed between the first transistor area and the second transistor area,
wherein the first contact plug is connected to the second contact plug by a metal layer.

22. The OTP cell of claim 21, wherein the first well region overlaps with the first contact plug and the second contact plug.

23. The OTP cell of claim 21, further comprising:
sidewall spacers disposed at sidewalls of the second gate electrode; and
a second well bias tap region disposed adjacent to the second gate electrode,
wherein the second well bias tap region is in contact with the sidewall spacers.

24. The OTP cell of claim 21, wherein the first well region and the second well region are partially separated by the isolation region, and are in contact with each other below the isolation region.

* * * * *